United States Patent
Hsu et al.

(10) Patent No.: US 9,302,907 B2
(45) Date of Patent: Apr. 5, 2016

(54) MICRO-ELECTRO-MECHANICAL-SYSTEM DEVICE WITH GUARD RING AND METHOD FOR MAKING SAME

(71) Applicants: Hsin Hui Hsu, HsinChu (TW); Sheng Ta Lee, HsinChu (TW); Chuan Wei Wang, HsinChu (TW)

(72) Inventors: Hsin Hui Hsu, HsinChu (TW); Sheng Ta Lee, HsinChu (TW); Chuan Wei Wang, HsinChu (TW)

(73) Assignee: PIXART IMAGING INCORPORATION, Hsin-Chu (TW)

( * ) Notice: Subject to any disclaimer, the term of this patent is extended or adjusted under 35 U.S.C. 154(b) by 0 days.

(21) Appl. No.: 14/670,766

(22) Filed: Mar. 27, 2015

(65) Prior Publication Data

US 2015/0197420 A1  Jul. 16, 2015

Related U.S. Application Data

(62) Division of application No. 12/391,613, filed on Feb. 24, 2009, now Pat. No. 9,018,718.

(51) Int. Cl.
| | |
|---|---|
| *H01L 41/113* | (2006.01) |
| *B81C 1/00* | (2006.01) |
| *H01L 41/047* | (2006.01) |
| *H01L 23/58* | (2006.01) |

(52) U.S. Cl.
CPC .......... *B81C 1/00698* (2013.01); *B81C 1/00571* (2013.01); *H01L 23/585* (2013.01); *H01L 41/0472* (2013.01); *B81C 2201/014* (2013.01); *B81C 2203/0109* (2013.01); *H01L 41/1132* (2013.01); *H01L 2924/0002* (2013.01); *H01L 2924/3025* (2013.01)

(58) Field of Classification Search
CPC ....................................... H01L 41/074–41/0478
See application file for complete search history.

(56) References Cited

U.S. PATENT DOCUMENTS

| | | | | |
|---|---|---|---|---|
| 6,225,145 | B1 * | 5/2001 | Choi | B81C 1/00301 257/E21.582 |
| 7,132,307 | B2 * | 11/2006 | Wang | H04R 19/005 381/191 |
| 7,148,077 | B2 * | 12/2006 | Fuertsch | B81B 3/007 257/419 |
| 7,659,150 | B1 * | 2/2010 | Monadgemi | B81C 1/00293 257/E23.193 |
| 8,026,120 | B2 * | 9/2011 | Kihara | H03H 3/0077 257/E21.531 |
| 8,372,675 | B2 * | 2/2013 | Hsu | B81C 1/00246 257/E21.002 |
| 9,006,897 | B2 * | 4/2015 | Di-Giacomo | H01L 23/528 257/415 |
| 9,190,954 | B2 * | 11/2015 | Yoshizawa | H01L 21/76802 |
| 2008/0105951 | A1 * | 5/2008 | Sato | B81C 1/00246 257/619 |
| 2008/0224241 | A1 * | 9/2008 | Inaba | B81B 3/0075 257/415 |

\* cited by examiner

*Primary Examiner* — Benjamin Sandvik
(74) *Attorney, Agent, or Firm* — Tung & Associates

(57) ABSTRACT

The present invention discloses a MEMS device with guard ring, and a method for making the MEMS device. The MEMS device comprises a bond pad and a sidewall surrounding and connecting with the bond pad, characterized in that the sidewall forms a guard ring by an etch-resistive material.

5 Claims, 2 Drawing Sheets

MICRO-ELECTRO-MECHANICAL-SYSTEM DEVICE WITH GUARD RING AND METHOD FOR MAKING SAME

BACKGROUND

1. Field of Invention

The present invention relates to a micro-electro-mechanical system (MEMS) device and a method for making the MEMS device, in particular to a MEMS device with guard ring and a method for making it.

2. Description of Related Art

MEMS devices are used in a wide variety of products such as micro-acoustical sensor, gyro-sensor, accelerometer, etc. The MEMS structure of a MEMS device is usually located on top of the wafer, so it should preferably be protected. The present invention thus provides a MEMS device with guard ring and a method for making it.

SUMMARY OF THE INVENTION

It is an objective of the present invention to provide a MEMS device with guard ring.

It is another objective of the present invention to provide a method for making a MEMS device with guard ring.

In accordance with the foregoing and other objectives of the present invention, from one aspect, the present invention discloses a MEMS device with guard ring, comprising: a substrate including transistor devices, part of interconnection and MEMS structure; a top dielectric layer formed on the substrate; a top metal layer, part of which forms the bond pad; and a sidewall surrounding and connecting with the bond pad, characterized in that the sidewall is made of an etch-resistive material and forms a guard ring laterally sealing the top dielectric layer.

The MEMS device may further comprise a shielding layer provided on the top dielectric layer and connected with the sidewall. The shielding layer and the guard ring can each be a single layer or a composite layer.

In another aspect, the present invention discloses a method for making a MEMS device with guard ring, comprising: providing a substrate including transistor devices, part of interconnection and MEMS structure; forming a top dielectric layer; forming a top metal layer, part of which forms a bond pad; and forming a sidewall guard ring connected with the bond pad by a material which is resistive to an etchant capable of etching the top dielectric layer, wherein the sidewall guard ring laterally seals the top dielectric layer.

The method may further comprise: forming a shielding layer on the top dielectric layer and connected with the sidewall.

It is to be understood that both the foregoing general description and the following detailed description are provided as examples, for illustration and not for limiting the scope of the invention.

BRIEF DESCRIPTION OF THE DRAWINGS

These and other features, aspects, and advantages of the present invention will become better understood with regard to the following description, appended claims, and accompanying drawings.

DESCRIPTION OF THE PREFERRED EMBODIMENTS

The drawings as referred to throughout the description of the present invention are for illustration only, but not drawn according to actual scale.

Figure 1A:
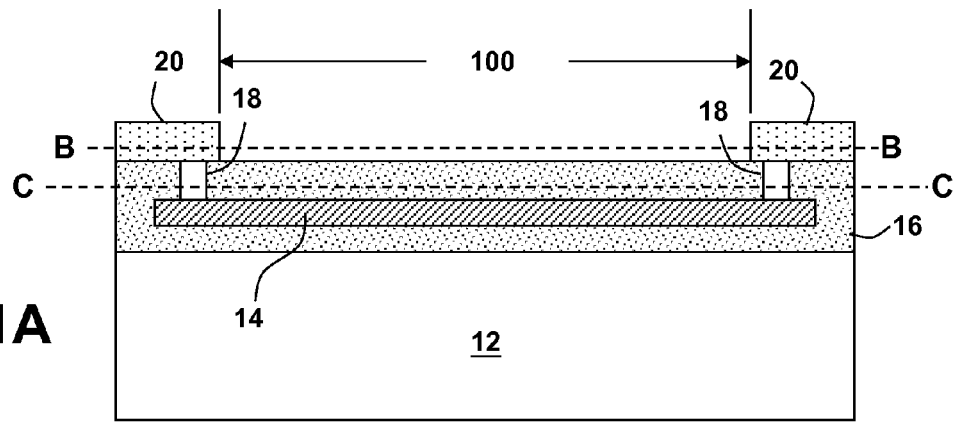
FIGS. 1A-1C show an embodiment according to the present invention.
Figure 1B:
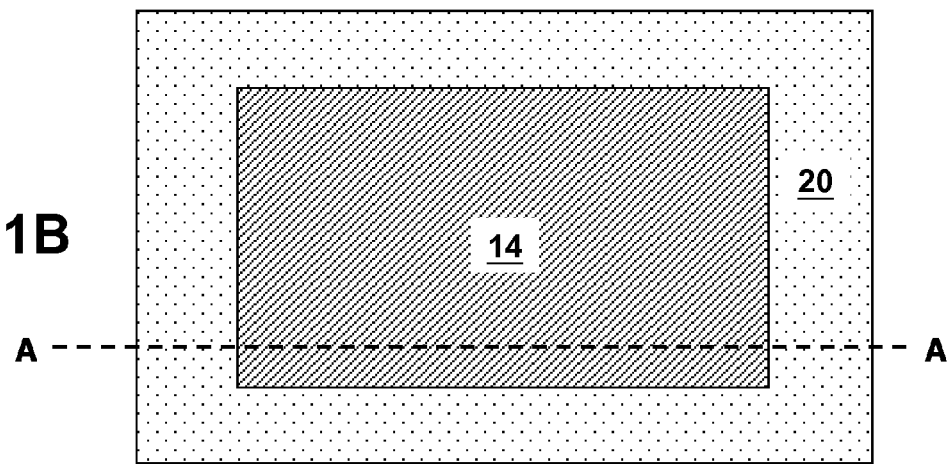
Figure 1C:
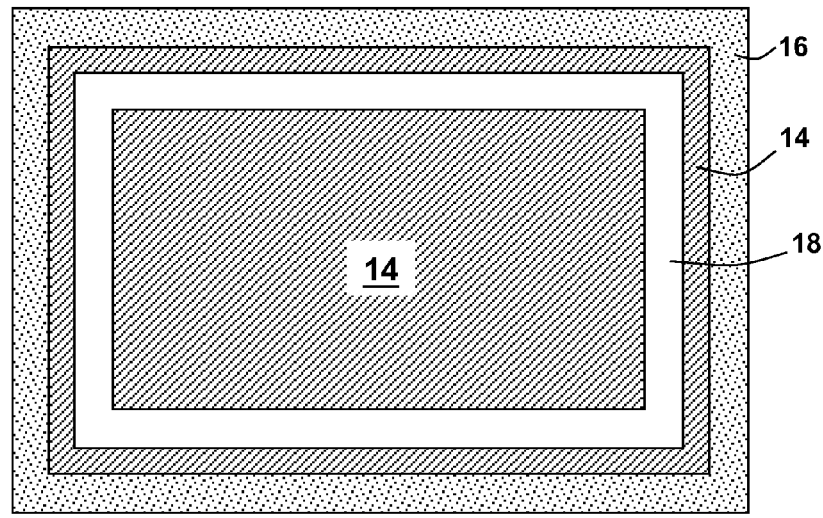

FIGS. 1A-1C shows a bond pad structure according to the first embodiment of the present invention, wherein FIG. 1B is a top view taken along the line B-B of FIG. 1A; FIG. 1C is a top view taken along the line C-C of FIG. 1A; and FIG. 1A is a cross sectional view taken along the line A-A of FIG. 1B. FIG. 1A shows a substrate 12 which has been processed to include transistor devices, part of the interconnection and MEMS structure (not shown), and also shows a top metal layer 14 which is provided as a bond pad on the substrate 12. The top metal layer 14 is isolated from the metal of the same level or the level beneath by a top dielectric layer 16. The top dielectric layer 16 for example can be made of an oxide such as silicon dioxide or a low-K material containing silicon dioxide.

The dielectric layer 16 needs to be etched during the process for forming the MEMS device. The present invention is characterized in that a guard ring 18 made of an etch-resistive material is formed as a sidewall surrounding the bond pad. The guard ring 18 seals the dielectric layer 16 laterally except the open area 100. A shielding layer 20 is provided on top of the dielectric layer 16, which is preferably also made of an etch-resistive material to protect the dielectric layer 16. The term "etch-resistive" means that the material is resistive to etch of the dielectric layer 16, that is, resistive to an etchant capable of etching the dielectric layer 16.

Depending on the material of the dielectric layer 16, the guard ring 18 and the shielding layer 20 can be a single or a composite layer made of any etch-resistive material. However, the guard ring 18 and the shielding layer 20 should not be electrically connected with each other; otherwise the bond pad and the surface of the overall device will be shorted together. As long as such premise is met, the guard ring 18 can be made of a material such as metal, amorphous silicon, silicon nitride, silicon oxynitride, or a composite material of two or more of the above materials, and the shielding layer 20 can be made of a material such as metal, amorphous silicon, silicon nitride, silicon oxynitride, or a composite material of two or more of the above materials.

Figure 2:
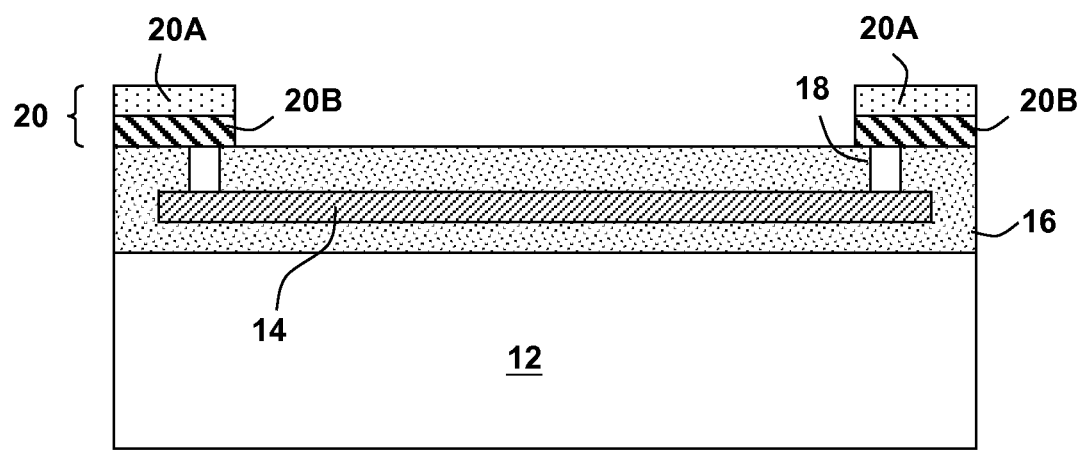
FIG. 2 shows another embodiment according to the present invention.

FIG. 2 shows a second embodiment according to the present invention. This embodiment is characterized in that the shielding layer 20 is a composite layer including an upper layer 20A and a lower layer 20B. The lower layer 20B can be a layer for enhancing the adhesion between the composite shielding layer 20 and the substrate beneath. Or, when the guard ring 18 is made of a conductive material, one of the upper layer 20A and the lower layer 20B can be made of an insulating material. In this embodiment, for example, the guard ring 18 can be made of a material such as metal, amorphous silicon, silicon nitride, silicon oxynitride, or a composite material of two or more of the above materials. The upper shielding layer 20A can be made of a material such as metal, amorphous silicon, silicon nitride, silicon oxynitride, or a composite material of two or more of the above materials. The lower shielding layer 20B can be made of a material such as metal, amorphous silicon, silicon nitride, silicon oxynitride, or a composite material of two or more of the above materials. "Metal" for example can be, but not limited to, aluminum or copper.

Although the present invention has been described in detail with reference to certain preferred embodiments thereof, the description is for illustrative purpose and not for limiting the scope of the invention. One skilled in this art can readily think of other modifications and variations in light of the teaching by the present invention. For example, the composite shielding layer 20 can include three or more layers. The guard ring 18 can also be made of a composite material. Therefore, all such modifications and variations should be interpreted to fall within the scope of the following claims and their equivalents.

What is claimed is:

1. A method for making a MEMS device with guard ring, comprising:
   providing a substrate including transistor devices, part of interconnection and MEMS structure;
   forming a top dielectric layer;
   forming a top metal layer, part of which forms a bond pad; and
   forming a sidewall on, surrounding and connected with the bond pad, the sidewall being disposed on and along all sides of the bond pad to extend upward from the bond pad in a direction opposing to a downward direction from the bond pad toward the substrate, to form a guard ring extending upward from the bond pad, wherein the sidewall is made of metal or amorphous silicon resistive to an etchant capable of etching the top dielectric layer, wherein the sidewall forms a guard ring; and
   after forming the sidewall, etching part of the top dielectric layer to release the MEMS device.

2. The method of claim 1, wherein the top dielectric layer is made of an oxide.

3. The method of claim 1, further comprising: forming a shielding layer on the top dielectric layer and connected with the sidewall.

4. The method of claim 1, wherein the shielding layer is made of a material of metal, amorphous silicon, silicon nitride, silicon oxynitride, or a composite material of two or more of the above materials.

5. The method of claim 1, wherein the shielding layer is a composite layer including two or more layers, and one of the layers is made of a material of metal, amorphous silicon, silicon nitride, silicon oxynitride, or a composite material of two or more of the above materials.

* * * * *